United States Patent [19]

Gregorian et al.

[11] 4,331,894
[45] May 25, 1982

[54] SWITCHED-CAPACITOR INTEROLATION FILTER

[75] Inventors: Roubik Gregorian, Santa Clara, Calif.; Toshiro Suzuki, Tokyo, Japan

[73] Assignee: American Microsystems, Inc., Santa Clara, Calif.

[21] Appl. No.: 154,574

[22] Filed: May 29, 1980

[51] Int. Cl.³ .................. H03H 11/00; H03F 1/34
[52] U.S. Cl. ............................. 307/520; 307/497; 307/577; 307/352; 330/107
[58] Field of Search ............... 328/20, 127, 151, 167, 328/186; 307/227, 497, 520, 577, 352, 353; 330/107

[56] References Cited

U.S. PATENT DOCUMENTS 3,676,784 7/1972 LeComte ........................... 328/186
4,179,665 12/1979 Gregorian ......................... 330/107
4,210,872 7/1980 Gregorian ....................... 330/107 X

OTHER PUBLICATIONS

IEEE Journal of Solid State Circuits, vol. SC12, No. 6, Dec. 1977, pp. 592-599, "Sampled Analog Filtering Using Switched Capacitors as Resistor Equivalents", by Caves et al.

Primary Examiner—John S. Heyman
Attorney, Agent, or Firm—Alan H. MacPherson; Steven F. Caserza; Richard Franklin

[57] ABSTRACT

An interpolation or smoothing filter circuit for a switched-capacitor system which transforms the sampled-and-held output signals from a switched-capacitor filter into sampled-and-held signals with a doubled sample rate. The circuit comprises an operational amplifier whose noninverting input lead is connected to a switched capacitor network which receives the sampled-and-held input signals at the normal sample rate. The network includes two separate capacitors controlled by switches operable at two alternating clock phases and connected to provide the desired summation and holding of charges. Feedback leads connected between the amplifier output lead and its noninverting input lead and containing additional capacitors cooperate with the input network to produce an output signal that is sampled-and-held at twice the sample rate of the input signal.

9 Claims, 3 Drawing Figures

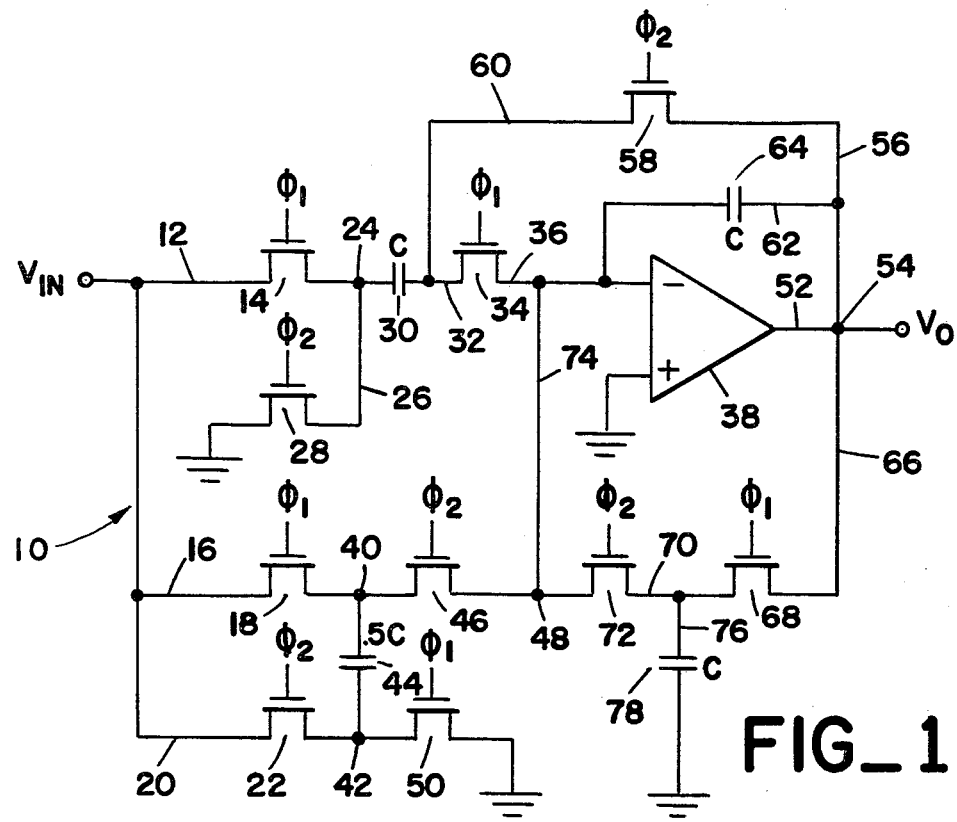
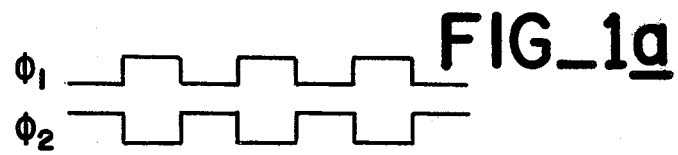
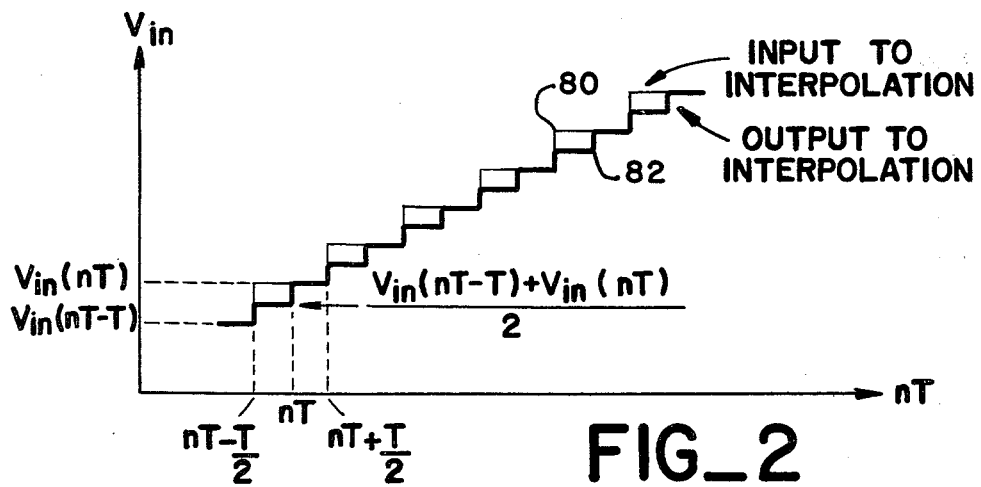

4,331,894

SWITCHED-CAPACITOR INTEROLATION FILTER

BACKGROUND OF THE INVENTION

This invention relates to sampled-data circuits and, more particularly, it relates to a switched-capacitor interpolation filter.

In a switched-capacitor filter of the type used in sampled-data circuits, the output signal is sampled and held at the clocking frequency. The frequency spectrum of the output signal ordinarily contains some extraneous components around the multiples of the sampling frequency. To get a smooth output, these components should be rejected. Heretofore, in order to eliminate the aforesaid undesired signal components, an off-chip analog smoothing filter was used in conjunction with a switched capacitor filter. However, this expedient added considerable complexity and size to the overall circuit as well as introducing other disadvantages. Another approach to the problem was to substantially increase the sampling rate for the main filter; but this resulted in a relatively high capacitor ratio spread and thus, a much larger silicon area for the filter, when the filter is implemented in integrated circuit form.

It is therefore one object of the present invention to provide a switched-capacitor interpolation filter that solves the problem of undesired frequency components without the disadvantages of prior expedients.

Another object of the invention is to provide a switched-capacitor interpolation filter capable of producing an output signal which is sampled and held at twice the clocking frequency of the filter while maintaining the same capacitor ratio spread of a filter clocked at half the sampling rate.

BRIEF SUMMARY OF THE INVENTION

In accordance with the present invention, an interpolation circuit is provided which transforms sampled-and-held signals from a switched capacitor filter into sampled-and-held signals with a doubled sample rate, thereby providing a smoothing function for the output signal. In effect, this circuit, by linear interpolation, removes the second replica (centered around the clocking frequency, $f_c$) of the signal spectrum and introduces an intermediate value between two adjacent steps of its input signal. In general, the circuit comprises an operational amplifier whose noninverting (−) input lead is connected to a switched capacitor network which receives sampled-and-held input signals from a filter at the normal sample rate. The network includes two separate capacitors controlled by switches operable at two alternating clock phases and connected to provide for the desired summation and holding of charges from the input signals. Feedback leads containing additional capacitors are connected between the output lead of the operational amplifier and its non-inverting input lead. The circuit produces the desired smoothing effect by producing an output signal that is sampled and held at twice the clocking frequency.

BRIEF DESCRIPTION OF THE DRAWING

FIG. 1 is a circuit diagram of a switched-capacitor interpolation filter according to the invention.

FIG. 1a is a timing diagram for the clocks used in the circuit of FIG. 1;

FIG. 2 is a diagram showing a comparison of typical input and output voltages for the circuit of FIG. 1.

DETAILED DESCRIPTION OF EMBODIMENT

With reference to the drawing, FIG. 1 shows a circuit diagram for a switched capacitor interpolation filter 10 according to the present invention. In a typical digital signal processing unit such as a coder-decoder (codec), the input lead 12 of this interpolation circuit 10 would be connected to the output lead of a switched-capacitor filter (not shown) whose output signal is sampled-and-held at the clocking frequency. The frequency spectrum of this output signal (shown as $V_{in}$ to the circuit 10) normally contains extraneous signal components around multiples of the sampling frequency, and the interpolation filter 10 must function to reject or eliminate the components around the sampling frequency to provide a smooth output signal $V_O$.

As shown, the input signal $V_{in}$ is provided in a lead 12 to a source/drain terminal of a first switch 14 which is preferably a metal-oxide-silicon field effect transistor (MOSFET). This same $V_{in}$ input signal is also supplied via a lead 16 to a source/drain terminal of a second MOSFET switch 18 and also via a lead 20 to one source/drain terminal of a third MOSFET switch 22.

The other source/drain terminal of the MOSFET switch 14 is connected to a junction 24 and its gate is connected to a phase one ($\phi_1$) clock. The junction 24 is connected via a lead 26 to one source/drain terminal of a MOSFET switch 28 whose other source/drain terminal is connected to ground and whose gate is connected to a phase two ($\phi_2$) clock. The junction 24 is also connected to one side of a capacitor 30 (having capacitance value C) whose other side is connected via a lead 32 to one source/drain terminal of a MOSFET switch 34 whose other source/drain terminal is connected via a lead 36 to the inverting input terminal of an operational amplifier 38. The non-inverting input terminal of this operational amplifier is connected to ground.

The second source/drain terminal of the MOSFET switch 18 is connected to a junction 40 and the second source/drain terminal of MOSFET switch 22 is connected to a junction 42, and these latter junctions are connected to opposite sides of a capacitor 44, whose capacitance value is one half that of the capacitor 30 (i.e. 0.5C). The gate lead of MOSFET 18 is connected to the phase one ($\phi$) clock, and the gate lead of MOSFET 46 is connected to the phase two ($\phi$) clock.

The junction 40 is also connected to one source/drain terminal of a MOSFET switch 46 whose other terminal is connected to a junction 48, and the junction 42 is also connected to one source/drain terminal of a MOSFET switch 50 whose other source/drain terminal is connected to ground.

The output signal ($V_O$) from the operational amplifier 38 is provided in a lead 52 having a junction 54 from which extends a feedback lead 56 connected to one source/drain terminal of a MOSFET switch 58 whose gate is connected to the phase two ($\phi_2$) clock. The other source/drain terminal of switch 58 is connected by a lead 60 to lead 32 between the capacitor 30 and switch 34. Connected between the lead 56 and the lead 36 is a feedback lead 62 containing a capacitor 64 (having capacitance value C) that also receives the output signal $V_O$.

Another feedback lead 66 extends from the junction 54 to one source/drain terminal of a MOSFET switch 68 whose other source/drain terminal is connected via a lead 70 to a source/drain terminal of another MOSFET switch 72. The switches 68 and 72 have gates connected to the phase one ($\phi_1$) and phase two ($\phi_2$) clocks, respectively. The other source/drain terminal of switch 72 is connected to the junction 48 which is connected to the input lead 36 via a return lead 74. Extending from the lead 70 between the switches 68 and 72 is a lead 76 which is connected to one side of a capacitor 78 whose other side is connected to ground.

In the operation of the circuit 10, a sampled-and-held input signal ($V_{in}$), as received from a switched-capacitor filter (not shown), is provided simultaneously on leads 12, 16 and 20. On clock phase one ($\phi_1$) switches 14 and 34 close, thus charging capacitors 30 and 64 to the input signal $V_{in}$. Switches 18 and 50 also close, thus charging capacitor 44 to the input signal $V_{in}$. Also, on clock phase one ($\phi_1$) the output signal $V_O$ from the operational amplifier 38, which has the same value as the input signal $V_{in}$, is charged on capacitor 78 through closed switch 68. Now, on clock phase two ($\phi_2$), switch 72 closes and switch 68 opens and the charge on the capacitor 78 is accumulated in feedback capacitor 64. This effectively cancels the voltage on the capacitor 64. At the same time, the bottom plate of the capacitor 44 is connected through closed switch 22 to the new or next sample of the input signal $V_{in}$, and the top plate of capacitor 44 is connected via closed switch 46 to the inverting input lead of the operational amplifier 38 so that the charge will also become integrated on capacitor 64. That is, the charge on capacitor 64 will be equal to the summation of the present and the previous value of the input signal voltage.

The smoothing function of circuit 10 is illustrated in FIG. 2 which shows a comparative diagram of simultaneous input and output signals for progressive clock cycles. As seen, the output signal $V_O$, instead of having a full step from the previous value of the input signal to the present value, has a step that is one half of that. When phase two clock ($\phi_2$) is on, the value of the output signal is charged on the capacitor 30 through the switches 58 and 28. Now, when phase two goes off and again phase one comes on, the bottom plate of capacitor 30 is connected to the input signal and its charge is integrated by the capacitor 64. Thus, the charge on the left plate of the capacitor 30, which was equal to the previous value of the output signal, cancels the charge on capacitor 64, and thus, at the end of phase 1 ($\phi_1$), the output signal $V_o$ is equal to the input signal $V_{in}$. Effectively what happens, as shown in FIG. 2, is that if the input signal is supplied having a "staircase" 80, in which the steps are repeated every phase one, the output signal has a "staircase" 82 with twice as many steps and the height of the output steps is one half of the corresponding height of the input steps.

Applying the waveform definitions illustrated in FIG. 2, the input-output relation at t=nT (where t=times, n=number of samples, and T=sampling period) is: $V_O(nT) = -0.5[V_{in}(nT) + V_{in}(nT-T)]$. Here, the relation $V_{in}(nT-T/2) = V_{in}(nT-T)$, evident from FIG. 2, is utilized.

At $t = nT + T/2$, $V_{in}(nT + T/2) = V_{in}(nT)$ holds, and hence, $V_O(nT + T/2) = -V_{in}(nT)$.

FIG. 2 shows that the desired input/output relations are realized and thus confirms that the circuit of FIG. 1 can be used as a sampling-rate-doubler filter.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. An interpolation circuit for receiving a sampled input signal and producing an output signal that is sampled at twice the input signal sampling frequency and thereby providing a smoothing filtering effect that eliminates extraneous output signal components around the input signal sampling frequency, said circuit comprising:

an operational amplifier having an inverting input lead, a noninverting input lead connected to ground, and an output lead;

an input terminal for receiving said sampled input signal;

a switched-capacitor input network connected between said inverting input lead and said input terminal, said network comprising a first and a second capacitor, said second capacitor having a predetermined fractional capacitance of said first capacitor; a first switch means connecting said first capacitor between said inverting input lead and said input terminal; a second switch means connecting said second capacitor between said inverting input lead and said input terminal, and a first clock and a second clock for controlling said first and said second switch means; and feedback means connected between said output lead and said inverting input lead, said feedback means cooperating with said input network to provide a sampled output signal at double the input signal sampling frequency and wherein every second output signal sample is equal to the input signal sample, and every other output signal sample is equal to a value interpolated from two adjacent input signal samples.

2. The circuit as described in claim 1 wherein said second capacitor of said input network has one-half the capacitance value as said first capacitor.

3. The circuit as described in claim 1 wherein said switch means are metal-oxide-silicon field effect transistors (MOSFETs) each having a gate electrode connected to one of said clocks.

4. An interpolation circuit for receiving a sampled input signal and producing an output signal that is sampled at twice the input signal sampling frequency and thereby providing a smoothing filtering effect that eliminates extraneous output signal components around the input signal sampling frequency, said circuit comprising:

an operational amplifier having an inverting input lead, a non-inverting input lead connected to ground, and an output lead;

an input terminal for receiving said sampled input signal;

a first and a second clock means;

a switched capacitor input network connected between said inverting input lead and said input terminal, said network comprising:

a first capacitor having a first and a second plate;

a first switch means connecting said first plate of said first capacitor to said input terminal;

a second switch means connecting said second plate of said first capacitor to said inverting input lead;

a first clock means for controlling said first and said second switch means;

a third switch means connecting said first plate of said first capacitor to ground;

a second clock means for controlling said third switch means;

a second capacitor having a pre-determined fractional capacitance of said first capacitor, said second capacitor having a first and a second plate;

a fourth switch means controlled by said first clock means, said fourth switch means being connected between said first plate of said second capacitor and said input terminal;

a fifth switch means controlled by said second clock, said fifth switch means being connected between said first plate of said second capacitor and said inverting input lead;

a sixth switch means controlled by said second clock means, said sixth switch means connected between said second plate of said second capacitor and said input terminal;

a seventh switch means controlled by said first clock means, said seventh switch means connected between said second plate of said second capacitor and ground; and feedback means connected between said output lead and said inverting input lead, said feedback means cooperating with said input network to provide a sampled output signal at double the input signal sampling frequency and wherein every second output signal sample is equal to the input signal sample, and every other output signal sample is equal to a value interpolated from the two adjacent input signal samples.

5. An interpolation circuit for receiving a sampled input signal and producing an output signal that is sampled at twice the input signal sampling frequency and thereby providing a smoothing filtering effect that eliminates extraneous output signal components around the input signal sampling frequency, said circuit comprising:

an operational amplifier having an inverting input lead, a non-inverting input lead connected to ground, and an output lead;

an input terminal for receiving said sampled input signals;

a switched capacitor input network connected between said inverting input lead and said input terminal, said network comprising:

a first and a second capacitor, said second capacitor having a pre-determined fractional capacitance of said first capacitor;

a first switch means for connecting said first capacitor between said inverting input lead and said input terminal;

a second switch means for connecting said second capacitor between said inverting input lead and said input terminal;

first and second clock means for controlling said first and second switch means; and feedback means connected between said output lead and said inverting input lead, said feedback means comprising:

a third capacitor connected between said inverting input lead and said output lead;

a third switch means controlled by said second clock, said third switch means connected between said second plate of said first capacitor and said output lead;

a fourth capacitor having a first plate and a second plate, said second plate of said fourth capacitor connected to ground;

a fourth switch means controlled by said first clock, said fourth switch means connected between said output lead and said first plate of said fourth capacitor; and a fifth switch means controlled by said second clock, said fifth switch means connected between said first plate of said fourth capacitor and said inverting input lead, wherein said feedback means cooperates with said input network to provide a sampled output signal at double the input signal sampling frequency and wherein every second output signal sample is equal to the input signal sample, and every other output signal sample is equal to a value interpolated from the two adjacent input signal samples.

6. An interpolation circuit for receiving a sampled input signal and producing a filtered output signal that is sampled at twice the input signal sampling frequency, thereby eliminating extraneous output signal components around the input signal sampling frequency, said circuit comprising:

an operational amplifier having an inverting input lead and an output lead;

an input terminal for receiving said sampled input signal;

a first capacitor having a first and a second plate;

a first switch means connecting said first plate of said first capacitor to said input terminal;

a second switch means connecting said second plate of said first capacitor to said inverting input lead;

a first clock means for controlling said first and said second switch means;

a third switch means connecting said first plate of said first capacitor to ground;

a second clock means for controlling said third switch means;

a second capacitor having a pre-determined fractional capacitance of said first capacitor, said second capacitor having a first and a second plate;

a fourth switch means controlled by said first clock means, said fourth switch means being connected between said first plate of said second capacitor and said input terminal;

a fifth switch means controlled by said second clock, said fifth switch means being connected between said first plate of said second capacitor and said inverting input lead;

a sixth switch means controlled by said second clock means, said sixth switch means connected between said second plate of said second capacitor and said input terminal;

a seventh switch means controlled by said first clock means, said seventh switch means connected between said second plate of said second capacitor and ground;

a third capacitor being connected between said inverting input lead and said output lead;

an eighth switch means controlled by said second clock, said eighth switch means connected between said second plate of said first capacitor and said output lead;

a fourth capacitor having a first plate and a second plate, said second plate of said fourth capacitor connected to ground;

a ninth switch means controlled by said first clock, said ninth switch means being connected between said output lead and said first plate of said fourth capacitor; and a tenth switch means controlled by said second clock, said tenth switch means being connected between said first plate of said fourth capacitor and said inverting input lead.

7. Structure as in claim 6 wherein said first, third, and fourth capacitors are of equal capacitance values twice the capacitance value of said second capacitor.

8. Structure as in claim 6 wherein each of said switch means comprises a MOSFET device.

9. The method of receiving a sampled input signal and producing a filtered output signal that is sampled at twice the input signal sampling frequency, thereby eliminating extraneous output signal components around the input signal sampling frequency, said method comprising the steps of:

receiving a first input signal sample;

charging an integration capacitor to the voltage level of said first input signal sample, thereby providing a first output signal sample having a voltage that is equal in magnitude to the voltage of said first input signal sample;

charging a storage capacitor to the voltage level of said first input signal, said storage capacitor having a fractional capacitance of the capacitance of said integration capacitor;

receiving a second input signal sample;

discharging said integration capacitor;

integrating on said integration capacitor the charge stored on said storage capacitor from said first input signal sample;

charging said storage capacitor to the voltage level of said second input signal sample; and integrating on said integration capacitor the charge stored on said storage capacitor from said second input signal, thereby providing a second output signal sample whose magnitude lies between the magnitude of said first input signal sample and the magnitude of said second input signal sample;

discharging said integration capacitor; and charging said integration capacitor to the voltage of said second input signal sample, thereby providing a third output signal sample equal in magnitude to said second input signal sample.

* * * * *

UNITED STATES PATENT AND TRADEMARK OFFICE
CERTIFICATE OF CORRECTION

PATENT NO. : 4,331,894
DATED : May 25, 1982
INVENTOR(S) : Roubik Gregorian, Santa Clara, California,
Toshiro Suzuki, Tokyo, Japan It is certified that error appears in the above—identified patent and that said Letters Patent is hereby corrected as shown below:

On the title page

In the title, delete "INTEROLATION" and insert --INTERPOLATION--.

[73] Assignee: After "American Microsystems, Inc., Santa Clara, California" insert --and Hitachi, Ltd., Tokyo, Japan.--

Column 1, in the title, delete "INTEROLATION" and insert --INTERPOLATION--.

Column 2, line 50, between "other" and "terminal" insert --source/drain--;

Column 3, line 32, delete "voltage";

Column 3, line 48, delete "V₀" and insert --$V_0$--;

Signed and Sealed this

Fourteenth Day of December 1982

[SEAL]

Attest:

GERALD J. MOSSINGHOFF

Attesting Officer

Commissioner of Patents and Trademarks